United States Patent [19]
Janssen

[11] Patent Number: 5,397,940
[45] Date of Patent: Mar. 14, 1995

[54] BUFFER SYSTEM WITH REDUCED INTERFERENCE

[75] Inventor: Daniël J. G. Janssen, Eindhoven, Netherlands

[73] Assignee: U.S. Philips Corporation, New York, N.Y.

[21] Appl. No.: 76,033

[22] Filed: Jun. 15, 1993

[30] Foreign Application Priority Data

Jul. 14, 1992 [EP] European Pat. Off. ............ 92202152

[51] Int. Cl.⁶ ................ H03K 19/0175; H03K 19/094
[52] U.S. Cl. ........................ 326/83; 326/122; 326/21; 327/307
[58] Field of Search ................ 307/475, 451, 443

[56] References Cited

U.S. PATENT DOCUMENTS

| | | | |
|---|---|---|---|
| 4,002,928 | 1/1977 | Goser et al. ................ | 307/251 |
| 4,045,691 | 8/1977 | Asano ........................ | 307/475 |
| 4,998,028 | 3/1991 | Chappell et al. ............ | 307/475 |
| 5,023,488 | 6/1991 | Gunning ..................... | 307/475 |
| 5,198,699 | 3/1993 | Hashimoto et al. ........ | 307/270 |

FOREIGN PATENT DOCUMENTS 2929450  3/1980  Germany .

Primary Examiner—Edward P. Westin
Assistant Examiner—Richard Roseen
Attorney, Agent, or Firm—Bernard Franzblau

[57] ABSTRACT

A system comprising an output buffer circuit and an input buffer circuit in which the output buffer circuit appreciably reduces the level of the signal to be transmitted between the two buffer circuits so as to, which corresponds to U.S. Pat. No. 4,305,009, disturbing signals in the output buffer circuit. These disturbing signals occur as a result of high peak currents during voltage transitions in the input signal, after which the original level is restored in the input buffer circuit. To further reduce the effect of disturbing signals, a reference voltage level, which is largely free of disturbing signals and relative to which the output signals of the output buffer circuit are determined, is likewise transmitted to the input buffer circuit. To increase the edge steepness of the signal to be transmitted, a series combination of an inverter and a capacitive voltage divider is coupled between the input of the output buffer circuit and the input of the input buffer circuit. Finally, the input buffer circuit comprises means for reducing the offset voltage.

25 Claims, 1 Drawing Sheet

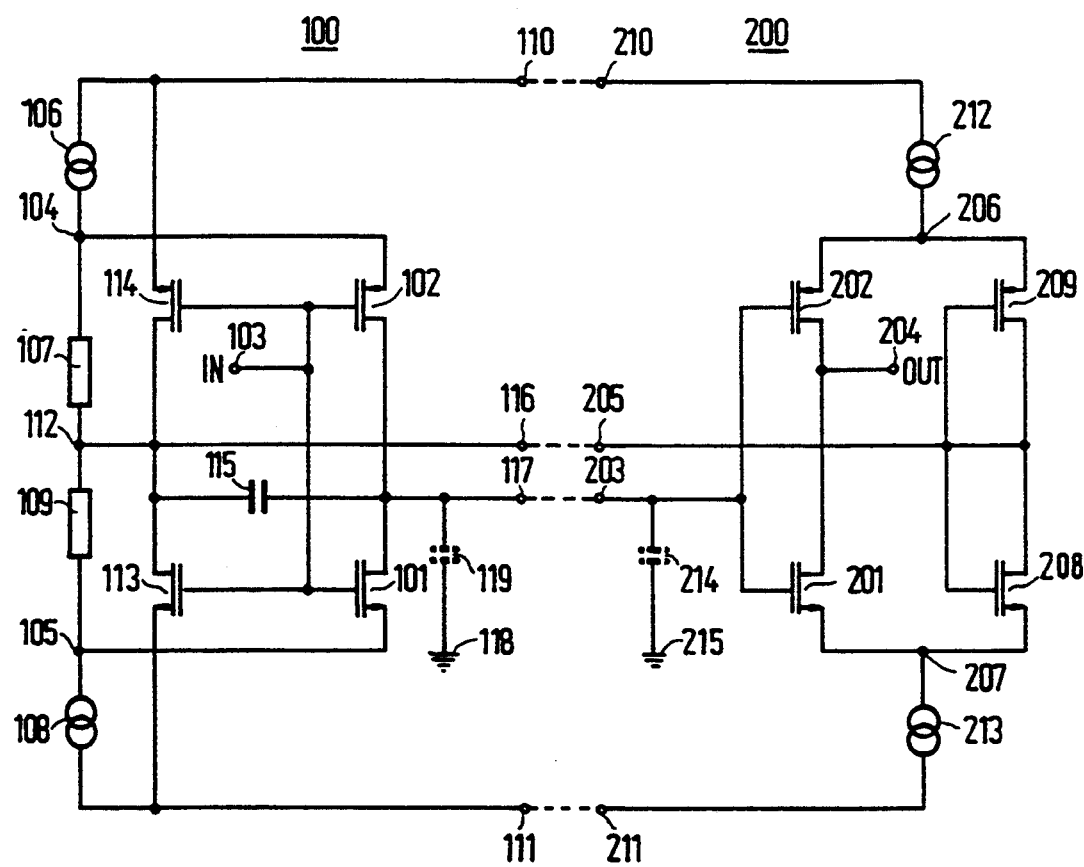

BUFFER SYSTEM WITH REDUCED INTERFERENCE

BACKGROUND OF THE INVENTION

This invention relates to a buffer circuit, more specifically, an output buffer circuit comprising a first inverter circuit with an input terminal and an output terminal which also form the input terminal and the output terminal of the buffer circuit, and with terminals for a first supply voltage, there being inserted between the input terminal and the output terminal of the buffer circuit a series combination of a second inverter circuit and a first capacitor, wherein the second inverter circuit is connected to terminals for a second supply voltage.

Preferably, symmetrical first and second supply voltages are used and the first inverter circuit comprises at least a complementary pair of field effect transistors whose gate and drain connections are mutually coupled, in which the input terminal is coupled to the mutually coupled gate connections and the output terminal is coupled to the mutually coupled drain connections, in which the source connection of the p-channel FET of the complementary pair is coupled to the terminal of the first positive supply voltage and the source connection of the n-channel FET of the pair is coupled to the terminal of the first negative supply voltage.

A buffer circuit of this type is known from DE-A-2929450 reduce the occurrence of in the form of a level shifter. This known circuit has for its object to convert an input voltage level into another, higher output voltage level while the output of the circuit comprising C-MOSFET's is capable of rapidly following voltage changes on the input. In order to increase the edge steepness of the output voltage, an inverter connected to the input terminal is provided. The inverter output terminal is connected to the output terminal of the buffer circuit via a capacitor coupled in series to the output terminal. The inverter is coupled, on one side, to the positive supply voltage terminal and, on the other side, to a connection for a negative supply voltage which is less negative than the negative supply voltage for the complementary pair of FET's. As a result of these measures the combination of the inverter and the capacitor, which forms a differentiator, transfers very rapidly input voltage variations with a limited voltage swing to the output of the circuit, while the final output voltage level is reached in a conventional manner when one of the FET's conducts in an, of necessity, slightly delayed manner. The switch delay occurring in a thus structured circuit of C-MOSFET's is distinctly smaller than in a circuit comprising exclusively C-MOSFET's.

A disadvantage the prior-art circuit is that the voltage swing at the output is determined, on the one hand, by the positive voltage level and, on the other hand, by the most negative voltage level so that, as a result of the high peak currents flowing through the supply lines during the voltage transitions, annoying disturbing signals occur everywhere in the circuit that comprises the buffer circuit.

SUMMARY OF THE INVENTION

It is an object of the invention to provide a buffer circuit and, more specifically, a system comprising an input buffer circuit and an associated output buffer circuit, in which the problem of the occurrence of disturbing signals due to the high peak currents during the voltage transitions in the output signal is largely suppressed, whereas the voltage transitions in the input signal can nevertheless be rapidly followed by the output.

According to a first aspect of the invention, the buffer circuit is, characterized in that the voltage swing of the output signal on the output terminal of the buffer circuit is a predetermined fraction of the voltage swing of the signal applied to the input terminal and in that means are provided for producing a reference voltage level.

The invention is based on the recognition that the problems occurring due to the high peak currents during the changing of the output voltage level may largely be suppressed, on the one hand, by fixing the output voltage of the buffer circuit at a considerably lower level in lieu of the customary TTL-compatible level of 5 volts, so that the peak currents occurring also are considerably smaller as a result of the much smaller voltage swing in the output signal determined by the maximum drive of the first inverter circuit and, on the other hand, by defining a reference voltage level situated between the two extreme voltage levels of the buffer circuit output voltage, while the line carrying this reference voltage does not conduct signal currents and is therefore largely free of disturbing signals so that that the relatively low output voltage level is not affected by disturbing signals.

The output voltage of the buffer circuit, together with the reference voltage whose level in the case of a symmetrical supply voltage is preferably situated between the second positive negative supply voltage levels, can be transferred to another circuit, for example, another IC which is then capable of reconstructing from these two signals the input signal of the buffer circuit in the other circuit.

Therefore, the invention likewise relates to an input buffer circuit which is capable of performing this operation, this buffer circuit comprising a third inverter circuit with an input terminal and an output terminal which also form the input and output terminals of the buffer circuit, and with terminals for the second supply voltage and which is characterized in that the third inverter circuit amplifies the signal received on the input terminal. The input buffer circuit has a second input terminal for receiving the reference voltage level and has means for reducing the offset voltage of the buffer circuit.

Preferably, the second supply voltage is a symmetrical supply voltage and the third inverter circuit comprises at least a complementary pair of field effect transistors, whose respective gate and drain connections are mutually coupled, in which the input terminal is coupled to the mutually coupled gate connections and the output terminal is coupled to the mutually coupled drain connections, in which the source connection of the p-channel FET of the complementary pair is coupled to the terminal of the second positive supply voltage and the source connection of the n-channel FET of the pair is coupled to the terminal of the second negative supply voltage.

In the input buffer circuit the complementary pair of FET's restores the input voltage up to the original voltage level having a 5-volt swing, the reducing means for reducing the offset voltage preferably comprising a further pair of complementary FET's, each one of these FET's having its gate and drain connections coupled and these mutually coupled connections of the two FET's being coupled to the second input terminal and the source connections of the two FET's being coupled to the source connection of the corresponding FET of the complementary pair. This measure limits the offset voltage of the input buffer circuit.

For predetermining the voltage which the inverter and the capacitor directly transfer to the output of the output buffer circuit, so that it does not exceed the output voltage of the buffer circuit itself which is undesired because it leads to signal distortion of the output signal in the form of overshoot, preferably between the output terminal of the output buffer circuit and a common voltage level (ground) and between the input terminal of the input buffer circuit and this common voltage level, preferably a second and a third capacitor respectively, are provided which, in combination with the first capacitor constitute a capacitive voltage divider for reducing the input voltage swing of the output buffer circuit to a maximum of the output voltage swing thereof.

It should further be observed that from U.S. Pat. No. 4,002,928 a system is known comprising an output buffer circuit and an input buffer circuit, which buffer circuits are present, for example, on the output side of an integrated circuit and the input side of another integrated circuit respectively, in which system the pulse-shaped signal to be transmitted is brought to a lower voltage level so as to increase the transmission ram in the output buffer circuit and is brought back to the original voltage level upon reception in the input buffer circuit. However, this known system does not comprise a separate reference voltage line, so that the signals are related to the voltage level on one of the supply voltage lines which may carry, even with lower signal levels, considerable disturbing signals due to the high supply currents during voltage transitions. Neither does the system according to the above United Stated Patent comprise means for improving the edge steepness of the signal to be transmitted.

BRIEF DESCRIPTION OF THE DRAWINGS

The invention will be further explained hereinafter with the aid of an exemplary embodiment with reference to the drawing in which the sole Figure shows a diagram of a system comprising an output buffer circuit and an input buffer circuit according to the invention.

DESCRIPTION OF THE PREFERRED EMBODIMENTS

In the drawing Figure there is shown, in general, an output buffer circuit denoted by reference numeral 100 and an input buffer circuit denoted by reference numeral 200 according to the invention. The two buffer circuits may be present, for example, in two separate integrated circuits, between which pulse-shaped (logic) signals are to be transmitted. Such integrated circuits (ICs) may, for example, form pan of an echo canceller for telephony purposes in which one IC comprises the analog interface to the telephone line and the other IC the digital circuit for the signal processing. A clock signal having a frequency of, for example, 7.68 MHz, a sign signal having a frequency of, for example, 80 kHZ, as well as the output signal of an analog-to-digital converter, for example, a sigma delta modulator, are then transmitted between such ICs. For each of the types of signal to be transmitted one IC could then comprise an output buffer circuit according to the invention and the other IC an input buffer circuit according to the invention. The buffer circuits according to the invention, however, may also be applied to many other types of circuits than those used for telephony.

The output buffer circuit 100 comprises a first inverter circuit preferably formed by an n-channel C-MOSFET 101 and a p-channel C-MOSFET 102, together forming a complementary pair, in which the gate and drain connections, respectively, of the FET's are mutually coupled. An input terminal 103 of the output buffer circuit is coupled to the mutually coupled gate connections and an output terminal 117 is coupled to the mutually coupled drain connections. The source connection of the FET 102 is coupled to a junction 104 for a first positive supply voltage and the source connection of the FET 101 is coupled to a junction 105 for a first negative supply voltage.

The voltage levels at the junctions 104 and 105 determine the maximum voltage swing of the output buffer circuit output voltage on terminal 117 and this swing, according to the exemplary embodiment, is ten times smaller than the swing of the voltage applied to the input 103. When the input voltage has the TTL compatible voltage swing of 5 volts, the output voltage thus has a voltage swing of 0.5 volt, which means that the supply voltage on the respective terminals 104 and 105 is to be $+250$ mV and $-250$ mV for the first inverter circuit. The positive voltage level is determined in a manner known per se by means of a series combination of a current source 106 and a resistor 107, which combination is inserted between the terminal 110 for a second positive supply voltage of, for example, $+2.5$ volts, and a reference voltage line 112. The voltage level of $+250$ mV is then available at the junction between the current source 106 and the resistor 107 when the current supplied by the current source and the magnitude of the resistor are properly chosen. In like manner the negative first supply voltage at junction 105 is determined by a current source 108 and a resistor 109, the current source 108 being connected to a terminal 111 for a second negative supply voltage of, for example, $-2.5$ volts. If the absolute values of the voltage levels at the junctions 104 and 105 are equally large and the magnitudes of the resistors 107 and 109 are equally large, the voltage level on line 112 is equal to 0 volts. By means of an inverter circuit structured in this manner an input voltage having a swing of 5 volts is converted into an inverted output voltage having a swing of 250 mV, which generates considerably smaller peak currents on the supply voltage lines 110 and 112, and thus a considerably lower interference level. According to a further aspect of the invention, however, the voltage level on the output terminal 117 is not related, as is customary in the state of the art, to one of the supply voltage levels on the line 110 or 111, nor is it related to the voltage level on the terminal 118 for the common voltage level (ground), in order to prevent that the, though low, but still present disturbing signals on these lines detrimentally affect the now relatively low output voltage level. According to the invention the output voltage is related to the reference voltage level on line 112 through which line no signal currents flow any longer, so that this reference voltage is very "pure".

Since inverter circuits comprising C-MOSFET's are relatively slow and are incapable of providing an output voltage with a very high edge steepness, the buffer circuit 100 comprises a second inverter circuit, preferably also constituted by C-MOSFET's, i.e. an n-channel C-MOSFET 113 and a p-channel C-MOSFET 114, together forming a complementary pair in which the gate and drain connections of the FET's are mutually coupled. The source connections of the FET's 113 and 114 are connected to the second negative supply voltage level of −2.5 volts on line 111 and the second positive supply voltage level of +2.5 volts on line 110 respectively. The mutually coupled gate connections are connected to the input terminal 103 and the mutually coupled drain connections are connected to the output terminal 117 by way of a capacitor 115. With this combination of an inverter circuit and a capacitor, input voltage variations may be transferred rapidly to the output so as to enhance the edge steepness of the output voltage. For a more detailed discussion of the operation of such a circuit reference is made to DE-A-2929450. It is undesired for the inverter circuit comprising the FET's 113 and 114 to transfer the complete voltage swing of 5 volts to the output 117 by way of the capacitor 115 because this may lead to overshoot in the output signal. Therefore, a second capacitor 119 is provided which is connected to the output terminal 117 and to the common voltage level at point 118 and which, together with the capacitor 115, forms a capacitive voltage divider limiting the voltage swing on output 117.

The input buffer circuit 200 comprises voltage supply terminals 215, 210 and 211 which carry the same supply voltage levels as the respective lines 118, 110 and 111 in the output buffer circuit 100 and which, according to the embodiment, thus carry the common voltage levels (ground), +2.5 volts and −2.5, volts respectively. The input buffer circuit 200 further includes an inverter circuit comprising an n-channel C-MOSFET 201 and a p-channel C-MOSFET 202 which together form a complementary pair in which the gate and drain connections of the FET's are mutually coupled. The input terminal 203 of the input buffer circuit is coupled to the mutually coupled gate connections and an output terminal 204 is coupled to the mutually coupled drain connections. The source connection of the FET 202 is coupled to a terminal 206 of a current source 212 which is supplied from the positive supply voltage line 210 and the source connection of the FET 201 is coupled to a terminal 207 of a current source 213 which is supplied from the negative supply voltage line 211. The FET's 201 and 202 may thus reconvert an input voltage having a 0.5-volt swing received from the output terminal 117 of the output buffer circuit 100 into an inverted output voltage having a 5-volt swing on the output terminal 204, so that the signal on the input 103 of circuit 100 is again available with the right polarity and voltage swing at the output 204 of circuit 200. In order to limit the offset voltage of the input buffer circuit 200, there are provided an n-channel C-MOSFET 208 and a p-channel C-MOSFET 209 which together form a complementary pair in which the gate and drain connections of these two FET's 208 and 209 are mutually coupled and are also connected to a terminal 205 for receiving the reference voltage level from terminal 116 of the circuit 100. The source connection of the n-channel C-MOSFET 208 is also connected to the terminal 207 of the current source 213 and the source connection of the p-channel C-MOSFET 209 is connected to the terminal 206 of the current source 212. Since the gate/drain voltage of the two FET's 208 and 209 has thus been made equal to 0 volts and by giving, on the one hand, the n-channel FET's 201 and 208 and, on the other hand, the p-channel FET's 202 and 209 largely identical features, the offset voltage may be reduced to a negligibly small level.

Between the input terminal 203 of the circuit 200 and the common supply line 215, a capacitor 214 is inserted which, in combination with the capacitor 119 of circuit 100, determines the divisor of the capacitive voltage divider. When the values of the capacitors 119 and 214 are computed, the magnitude of the already available (parasitic) output capacitance or input capacitance respectively, of the circuits 100 and 200 may be taken into account.

I claim:

1. A buffer circuit comprising; a first inverter circuit coupled to terminals of a first supply voltage and having an input terminal and an output terminal which form an input terminal and an output terminal of the buffer circuit, means for coupling between the input terminal and the output terminal of the buffer circuit a series combination of a second inverter circuit and a first capacitor, wherein the second inverter circuit is connected to terminals of a second supply voltage, means for limiting the voltage swing of the output signal at the output terminal of the buffer circuit to a predetermined fraction of the voltage swing of a signal applied to the input terminal, and means for producing a reference voltage level at a further output terminal of the buffer circuit.

2. A buffer circuit as claimed in claim 1, wherein the first and second supply voltages are symmetrical supply voltages, the first inverter circuit comprises at least a complementary pair of field effect transistors whose gate and drain connections respectively, are mutually coupled, wherein the input terminal is coupled to the mutually coupled gate connections and the output terminal is coupled to the mutually coupled drain connections, in which the source connection of the p-channel FET of the complementary pair is coupled to a positive terminal of the first supply voltage and the source connection of the n-channel FET of the complementary pair is coupled to a negative terminal of the first supply voltage, and in that the reference voltage level is at a voltage level between a positive and a negative voltage level of the second supply voltage.

3. A buffer circuit as claimed in claim 2 and comprising a further buffer circuit including a third inverter circuit having an input terminal and an output terminal which form the input and output terminals of the further buffer circuit, and having terminals for receiving the second supply voltage, wherein the third inverter circuit presents at its output terminal an enlarged version of the voltage swing of the signal received at the input terminal, said third inverter circuit having a second input terminal for receiving the reference voltage level, and means for reducing an offset voltage of the further buffer circuit.

4. A buffer circuit as claimed in claim 3, wherein the second supply voltage is a symmetrical supply voltage, the third inverter circuit comprises at least a complementary pair of field effect transistors whose respective gate and drain connections are mutually coupled, in which the input terminal of the further buffer circuit is coupled to the mutually coupled gate connections and the output terminal of the further buffer circuit is coupled to the mutually coupled drain connections, and wherein a source connection of a p-channel FET of the complementary pair is coupled to the positive terminal of the second supply voltage and a source connection of an n-channel FET of the complementary pair is coupled to the negative terminal of the second supply voltage.

5. A buffer circuit as claimed in claim 4 wherein the means for reducing the offset voltage of the buffer circuit comprises a further pair of complementary FET's, in which each one of said further complementary FET's has its gate and drain connections mutually coupled and with said mutually coupled connections of the further pair of complementary FET's coupled to the second input terminal and with the source connections of the further pair of complementary FET's coupled to the respective source connection of a corresponding FET of the complementary pair of FET's of the third inverter circuit.

6. A buffer circuit as claimed in claim 3 wherein the voltage swing of the signal at the output terminal of the further buffer circuit is the same as that of the signal on the input terminal of the buffer circuit.

7. A buffer circuit as claimed in claim 2 wherein all of the FET's comprise C-MOSFET's.

8. A buffer circuit as claimed in claim 1 wherein the first supply voltage level is +250 mV and −250 mV, and the second supply voltage level is +5 volts and −5 volts.

9. A combination buffer circuit comprising a buffer circuit as claimed in claim 1 and further comprising a second buffer circuit including a third inverter circuit having an input terminal and an output terminal which comprise the input and output terminals, respectively, of the second buffer circuit, and with terminals for coupling to the second supply voltage, wherein the third inverter circuit presents at its output terminal an amplified version of the voltage swing of the signal received at the input terminal, said second buffer circuit having a second input terminal for receiving the reference voltage level, and means coupled to the third inverter circuit and to the second input terminal for reducing an offset voltage of the second buffer circuit.

10. A combination buffer circuit as claimed in claim 9, wherein the second supply voltage is a symmetrical supply voltage, the third inverter circuit comprises at least a complementary pair of field effect transistors whose respective gate and drain connections are mutually coupled, in which the input terminal of the second buffer circuit is coupled to the mutually coupled gate connections and the output terminal of the second buffer circuit is coupled to the mutually coupled drain connections, in which a source connection of a p-channel FET of the complementary pair is coupled to the positive terminal of the second supply voltage and a source connection of an n-channel FET of the complementary pair is coupled to the negative terminal of the second supply voltage.

11. A combination buffer circuit as claimed in claim 10 wherein the means for reducing the offset voltage of the second buffer circuit comprises a further pair of complementary FET's, in which each one of said further pair of complementary FET's has its gate and drain connections mutually coupled and with said mutually coupled connections of the further pair of complementary FET's coupled to the second input terminal, and wherein the source connections of the further pair of complementary FET's are coupled to a respective source connection of a corresponding FET of the complementary pair of field effect transistors of the third inverter circuit.

12. A combination buffer circuit as claimed in claim 9 wherein the means for reducing the offset voltage of the second buffer circuit comprises a further pair of complementary FET's, in which each one of said further pair of complementary FET's has its gate and drain connections mutually coupled and with said mutually coupled connections of the further pair of FET's coupled to the second input terminal, and wherein the source connections of the further pair of FET's are coupled to a respective source connection of a corresponding FET of the complementary pair of field effect transistors of the third inverter circuit.

13. A combination buffer circuit as claimed in claim 12 wherein the voltage swing of the signal at the output terminal of the second buffer circuit is the same as that of the signal on the input terminal of the first buffer circuit.

14. A combination buffer circuit as claimed in claim 9 wherein the voltage swing of the signal at the output terminal of the second buffer circuit is the same as that of the signal on the input terminal of the first buffer circuit.

15. A buffer circuit as claimed in claim 1 wherein the first inverter circuit comprises a first complementary pair of transistors connected in series to said first supply voltage terminals and with each transistor having a control electrode coupled to the input terminal and a first main electrode coupled in common to said output terminal, and the second inverter circuit comprises a second complementary pair of transistors connected in series to said terminals of the second supply voltage and with each transistor having a control electrode coupled to the input terminal and a first main electrode coupled in common to said further output terminal.

16. The buffer circuit as claimed in claim 1 wherein the first inverter circuit comprises a first complementary pair of transistors connected in series with current source means to said second supply voltage terminals and with each transistor having a control electrode coupled to the input terminal and a first main electrode coupled in common to said output terminal, and wherein said further output terminal is connected to a circuit point between a positive terminal and a negative terminal of the first supply voltage and at which said reference voltage level is produced.

17. The buffer circuit as claimed in claim 1 further comprising a second capacitor connected between said output terminal and a circuit point at a common reference voltage level so as to form in combination with the first capacitor a capacitive voltage divider.

18. The buffer circuit as claimed in claim 1 wherein first and second voltage supply terminals of the first inverter circuit are coupled to respective positive and negative terminals of the first supply voltage and the first supply voltage is lower than the second supply voltage, thereby to form said voltage swing limiting means.

19. The buffer circuit as claimed in claim 1 further comprising a second buffer circuit comprising a third inverter circuit having an input terminal coupled to the output terminal of the first buffer circuit and having an output terminal which produces an amplified version of an input signal received at its input terminal, and means coupling the third inverter circuit to said terminals of the second supply voltage.

20. The buffer circuit as claimed in claim 19 wherein the second buffer circuit further comprises a further input terminal coupled to said further output terminal of the first buffer circuit, and means coupled to said further input terminal of the second buffer circuit for reducing an offset voltage of the second buffer circuit.

21. The buffer circuit as claimed in claim 20 wherein said offset voltage reducing means comprises;
a pair of complementary transistors connected in series to the terminals of the second supply voltage and having respective control electrodes and respective first main electrodes connected to said further input terminal of the second buffer circuit.

22. A buffer circuit system comprising:
first and second buffer circuits each having an input terminal and an output terminal wherein the output terminal of the first buffer circuit is adapted to be coupled to the input terminal of the second buffer circuit and the input terminal of the first buffer circuit is adapted to receive a signal to be processed by the buffer circuit system, wherein
the first buffer circuit comprises;
a first inverter circuit coupled to terminals of a first supply voltage and having an input terminal and an output terminal which comprise said input terminal and said output terminal, respectively, of the first buffer circuit, first means for coupling a second inverter circuit and a first capacitor in series circuit between said input terminal and said output terminal of the first buffer circuit, wherein the second inverter circuit is coupled to terminals of a second supply voltage, means for limiting the voltage swing of an output signal at the output terminal of the first buffer circuit, and means for producing a reference voltage at a further output terminal of the first buffer circuit, and wherein
the second buffer circuit comprises;
a third inverter circuit adapted to be coupled to the terminals of the second supply voltage and having an input terminal and an output terminal which comprise said input terminal and said output terminal, respectively, of the second buffer circuit, and a second input terminal adapted to be coupled to the further output terminal of the first buffer circuit so as to receive said reference voltage.

23. A buffer circuit system as claimed in claim 22 wherein the second buffer circuit further comprises means for reducing an offset voltage of the second buffer circuit, said buffer circuit system further comprising;
second and third capacitors coupled between the output terminal of the first buffer circuit and a common voltage point and between the input terminal of the second buffer circuit and said common voltage point, respectively.

24. A buffer circuit system as claimed in claim 22 wherein the second buffer circuit further comprises means for reducing an offset voltage of the second buffer circuit, said reducing means comprising:
a pair of complementary transistors connected in a series circuit adapted to be coupled to the terminals of the second supply voltage, and wherein respective control electrodes of said pair of complementary transistors are connected in common to said second input terminal of the second buffer circuit.

25. A voltage processing circuit comprising:
a first inverter circuit having an input terminal for receiving an input voltage and having an output terminal,
a second inverter circuit,
a capacitor,
first means for coupling said second inverter circuit and said second capacitor in series circuit between said input and output terminals,
second means for coupling the second inverter circuit to first and second terminals of a first D.C. supply voltage,
third means for coupling the first inverter circuit to first and second terminals of a second D.C. supply voltage that is lower than said first D.C. supply voltage in a manner whereby a voltage swing of an output voltage at the output terminal is limited to a fraction of a voltage swing of an input voltage applied to the input terminal, and
means coupled to at least one of said D.C. supply voltages for deriving a reference voltage level for said output voltage of the voltage processing circuit.

* * * * *